US006651112B1

United States Patent
Reichel

(10) Patent No.: US 6,651,112 B1
(45) Date of Patent: Nov. 18, 2003

(54) DATA TRANSMISSION BETWEEN CONNECTED MODULES WHEREIN EACH MODULE SEPARATELY AND DIRECTLY COMMUNICATION WITH EACH OTHER MODULES

(75) Inventor: Reinhard Reichel, Stockach (DE)

(73) Assignee: Bodenseewerk Geratetechnik GmbH (DE)

( * ) Notice: Subject to any disclaimer, the term of this patent is extended or adjusted under 35 U.S.C. 154(b) by 0 days.

(21) Appl. No.: 09/579,452

(22) Filed: May 26, 2000

(30) Foreign Application Priority Data

Jun. 11, 1999 (DE) .......................... 199 26 849

(51) Int. Cl.⁷ .............................................. G06F 13/00
(52) U.S. Cl. ........................ 710/20; 710/7; 710/25; 710/106; 710/117; 370/347; 370/242
(58) Field of Search .................. 710/20, 7, 25, 710/106, 117; 370/347, 242

(56) References Cited

U.S. PATENT DOCUMENTS

| 4,562,535 A | 12/1985 | Vincent et al. ............. 710/104 |
| 5,408,616 A | 4/1995 | Murr ......................... 710/301 |
| 5,724,343 A | 3/1998 | Pain et al. .................. 370/242 |
| 5,894,474 A * | 4/1999 | Maison et al. ............. 370/347 |
| 5,954,810 A * | 9/1999 | Toillon et al. ............. 710/315 |
| 6,467,003 B1 * | 10/2002 | Doerenberg et al. ........ 710/117 |

FOREIGN PATENT DOCUMENTS

| DE | 34 17 451 A1 | 11/1985 |
| DE | 34 17 451 C2 | 6/1986 |
| DE | 41 32 994 A1 | 4/1993 |
| DE | 41 32 994 C2 | 4/1995 |
| DE | 44 12 310 | 11/1995 |
| EP | 0 824 302 A1 | 2/1998 |
| EP | 0 824 303 A1 | 2/1998 |

OTHER PUBLICATIONS

Airlines Electronic Engineering Committee, Backplane Data Bus ARINC Specification 659, Published Dec. 27, 1993, Cover Pages, Foreword, Table of Contents, pp. 1–6.

* cited by examiner

Primary Examiner—Jeffrey Gaffin
Assistant Examiner—Tammara Peyton
(74) Attorney, Agent, or Firm—Mallinckrodt & Mallinckrodt; Robert R. Mallinckrodt

(57) ABSTRACT

A modular electronic device has a cabinet frame, a plurality of push-in modules with module frames retained in the cabinet frame side-by-side, and printed circuit boards mounted in the module frames, and electronic components carried by said printed circuit boards. Each of these modules has autonomous data transmitting connections for communicating directly with each of the other ones of the modules.

14 Claims, 5 Drawing Sheets

DATA TRANSMISSION BETWEEN CONNECTED MODULES WHEREIN EACH MODULE SEPARATELY AND DIRECTLY COMMUNICATION WITH EACH OTHER MODULES

BACKGROUND OF THE INVENTION

The invention relates to a modular electronic device. More specifically, the electronic device has a cabinet frame. The modules have module frames. Printed circuit boards are held in the module frames. Electronic components are mounted on the printed circuit boards. The modules with the module frames are pushed into the cabinet frame side-by-side and can be pulled out individually.

Furthermore the invention relates to a method of communication between such modules.

In avionics, different avionic functions are installed in autonomous units. When a failure occurs, the whole unit will be exchanged. Quite often, this unit consists of a housing in which the individual avionic functions are installed. The tendency, in avionics, is, however, using modular systems. This offers the advantage that, in the case of a failure of an avionic function, it will not be necessary to exchange the whole unit, but only the failing module needs to be exchanged. As a rule, these modules are printed circuit boards carrying electronic components. The printed circuit boards are mounted in a module frame, which can be pushed into a cabinet frame.

Information has to be exchanged between the individual modules. In the prior art, the communication is established through a data bus extending in the back wall of the cabinet frame. When the module are pushed into the cabinet frame, they are interconnected through appropriate plug-and-socket connectors connecting each module with the data bus.

The priciple of data busses is well known. A classical "multi-transmitter /multi-receiver"—data bus is a multi-wire line for data transfer between a plurality of functional units. With such a bus structure, basically one transmission line is required, all units being connected with this transmission line. The communication of all units is carried out through through this transmission line. This is, on one hand, a simple structure. However this simple structure, on the other hand, requires a complex administration. As, in principle, all connected units are able to transmit and to receive messages, care has to be taken to prevent a plurality of different units from transmitting data simultaneously, and to ensure that only those units for which the instantaneously transmitted data are intended are switched on reception. Therefore, the administration of the bus is usually handled by a particular bus controller.

The ARINC-standard "ARINC 659" describes a so-called "backplane bus". The backplane bus is a bus system which is arranged in the back wall or backplane of a push-in cabinet. In this standard. The bus system is a so-called "multiplex-bus" German patent 41 32 994 describes a modular push-in system comprising modules with printed circuit boards, which carry electric components.

Published European patent application EP 0,824,302 A1 describes a modular electronic device with printed circuit boards carrying electric components. The printed circuit boards are mounted in module frames of push-in modules. The push-in modules, in turn, are retractably retained in a cabinet frame. The push-in modules are electrically connected with a backplane component.

Published German patent application 34 17 451 describes a right-parallelepipedal push-in system for an electronic device into which printed circuit board inserts or the like can be pushed in.

The prior art module communication of push-in insert cabinets suffers from the disadvantage that the safety of the data transfer from one module to another cannot be ensured without limitations. Avoiding collisions requires expensive organisation of the data flux. At the same time, however, this increases the error proneness of the data flux, as the communication processes between the individual modules are not mutually independent.

It has been found disadvantageous with prior art devices that conventional bus structures do not permit easy recognition, when the communication of a module is no longer operative.

DISCLOSURE OF THE INVENTION

It is an object of the invention to provide a modular electronic device which avoids the disadvantages of the prior art.

It is a further object of the invention to ensure that communication within the electronic device is collision-free, determined in time and, during data transmission, independent of other devices or internal functions.

To this end a modular electronic device comprising a cabinet frame, a plurality of push-in modules with module frames retained in said cabinet frame side-by-side, and printed circuit boards mounted in said module frames, and electronic components carried by said printed circuit boards is provided, wherein each of said modules has autonomous data transmitting means for communicating directly with each of the other ones of said modules.

In a method of communication between modules of a modular electronic device comprising a cabinet frame, a plurality of push-in modules with module frames retained in said cabinet frame, and printed circuit boards mounted in said module frames, and electronic components carried by said printed circuit boards, said modules are directly interconnected for data exchange.

Thanks to the direct transmission of the data from one module to another, freedom of collision during data transfer is achieved. The control of the communication between the modules is independent of the processor units of the modules. When direct communication of the modules with each other is used, it is considerably more easy than with the prior art to add further modules to a already communicating module system. The communication of already communicating modules is not disturbed by added modules.

Preferably, said data transmitting means of each of said modules comprise a data transmitting controller. This controller controls the data transmission to the other modules. Data memories provided in the respective modules and connected with the data transmitting means permits temporary storage of data.

A further advantageous modification is that the data transmitting means have both a transmitting device for data transmission and a corresponding receiver device. It may, however, also be sufficient if either a receiver device only is provided in the data transmission means or a transmitting device.

By using a time-controlled communication protocol, the data transmission becomes transparent and safer.

Interfaces at the modules establish, in the cabinet frame, the communication with the remaining modules.

Preferably, the electronic devices of the invention are used in aircraft. Then, the cabinet frame of the electronic device may be an integral part of the aircraft.

DETAILED DESCRIPTION OF PREFERRED EMBODIMENTS

Figure 1:
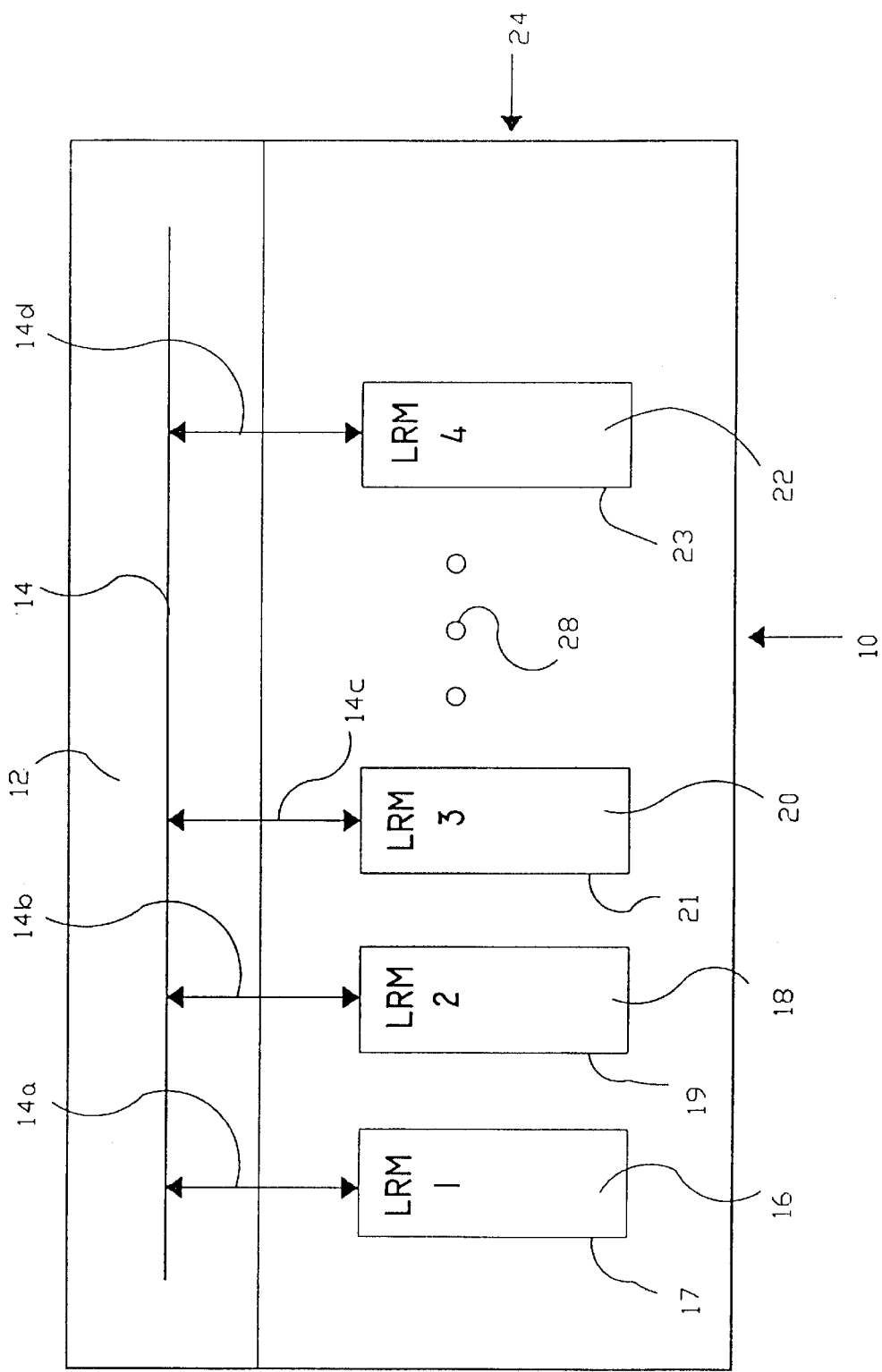
FIG. 1 is a schematic illustration of the cabinet frame with a multiplex data bus and removable modules according to the prior art.

In order to facilitate the description of the invention, the operation of a prior art electronic device of the present type is described with reference to FIG. 1. Referring to FIG. 1, numeral 10 designates a cabinet frame. In its rear wall 12, the cabinet frame has a single multiplex-data bus 14. In the simplest case, this multiplex-data bus 14 consists of a cable. Exchangeable electronic modules 16, 18, 20, 22 are pushed into the cabinet frame 10. To this end, the modules 16, 18, 20, 22 each have a module frame 17, 19, 21, 23, which can be pushed into the cabinet frame 10, until they make contact with a power supply and the multiplex-data bus 14. The number of modules 16, 18, 20, 22 are dependent on the accommodation capacity of the cabinet frame. The individual modules 16, 18, 20, 22 are interconnected through multiplex-data bus 14. This is illustrated by arrows 14a, 14b, 14c, 14d. The data flux between the modules 16, 18, 20, 22 of the cabinet frame 10 is controlled either by a bus controller or by a corresponding transmission protocol of each individual module in multiplex operation. As a whole, the cabinet frame 10 with the modules 16, 18, 20, 22 and the data bus 14 form an operative electronic device 24.

Figure 2:
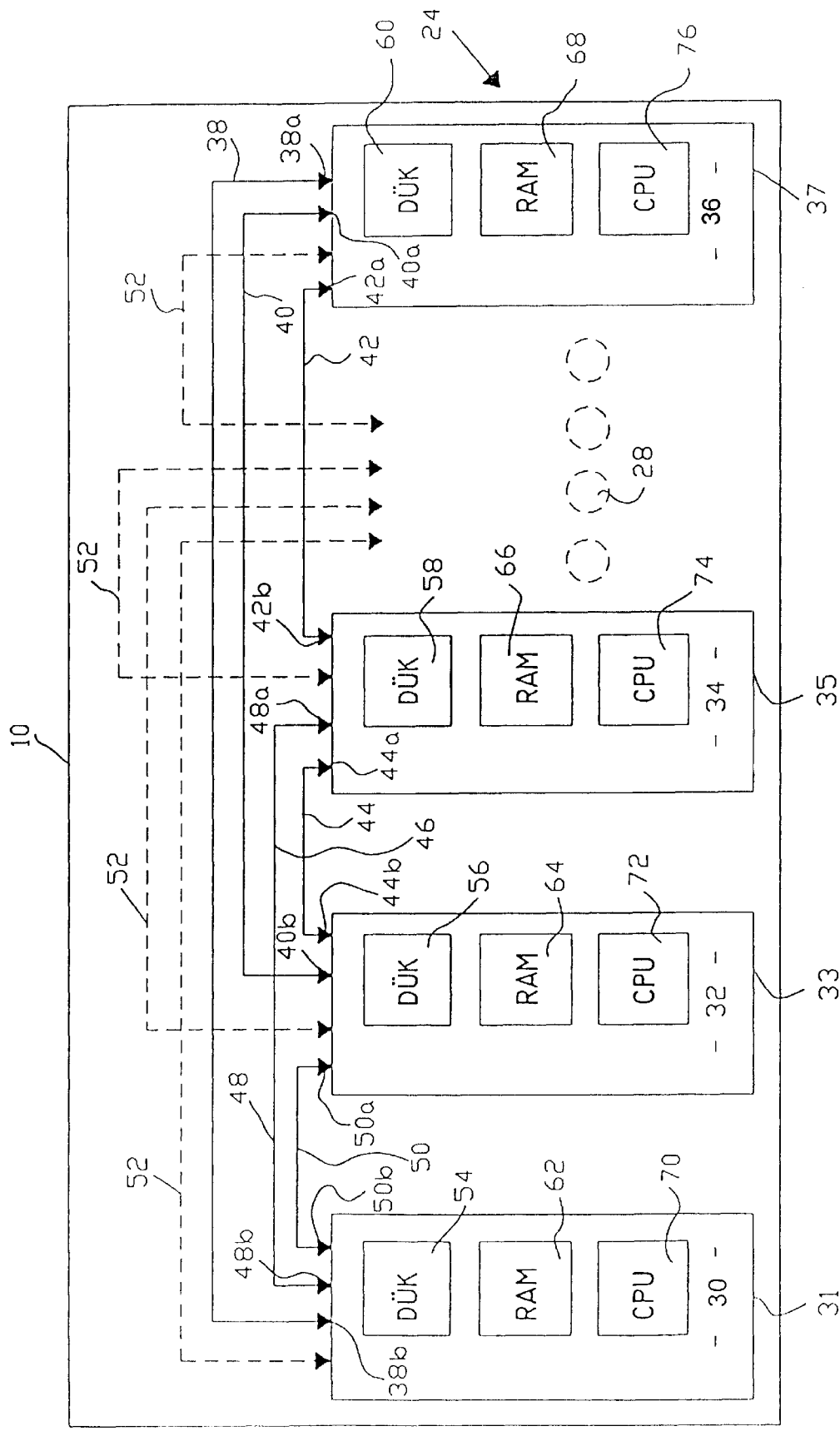
FIG. 2 is a schematic illustration of an electronic device of the invention with direct module communication.

FIG. 2 shows an electronic device 24 similar to FIG. 1. In this electronic device, however, no data bus is used. The exchangeable electronic modules 30, 32, 34, 36 are pushed or inserted into the cabinet frame 10. To this end, the modules 30, 32, 34, 36 have module frames 31, 33, 35, 37 which can be pushed or inserted into the cabinet frame, until they make contact with a power supply. The dots 28 indicate that any number of modules (not shown) may be used. The number of modules 30, 32, 34, 36 depends on the accommodation capacity of the cabinet frame 10. Here, according to the invention, each module 30, 32, 34, 36 is directly connected with the other modules 30, 32, 34, 36 through direct connections 38, 40, 42, 44, 48, 50.

Arrows 38a, 40a, 42a, 46a, 48a, 50a, 38b, 40b, 42b, 46b, 48b, 50b indicate that the data flux through the direct connections may be in two directions. In the present embodiment, this is achieved, with each pair of modules, by two separate unidirectional connections. At least one data bus is used for each direction of the data flux and each receiver. If required, also a unidirectional connection can be used, such that the data flux passes in one direction only through one separate connection. The connections for the data transmitting may be adapted both for serial or parallel transmission.

Dashed lines 52 indicate further direct connections with modules not shown for clarity. Each of the modules has its own data transmission controller (DÜK) 54, 56, 58, 60. The data transmission controller (DÜK) 54, 56, 58, 60 have specific components or, with integrated circuits, specific functions for data transmission. Furthermore, a data memory (RAM) 62, 64, 66, 68 and a processor unit (CPU) 70, 72, 74 and 76 are provided in each of the modules 30, 32, 34 36, respectively. The data transmission controller (DÜK) 54, 56, 58, 60 control the communication with the respective other modules. As a whole, the cabinet frame 10 with the modules 30, 32, 34 and 36 form an operative electronic device.

Figure 2A:
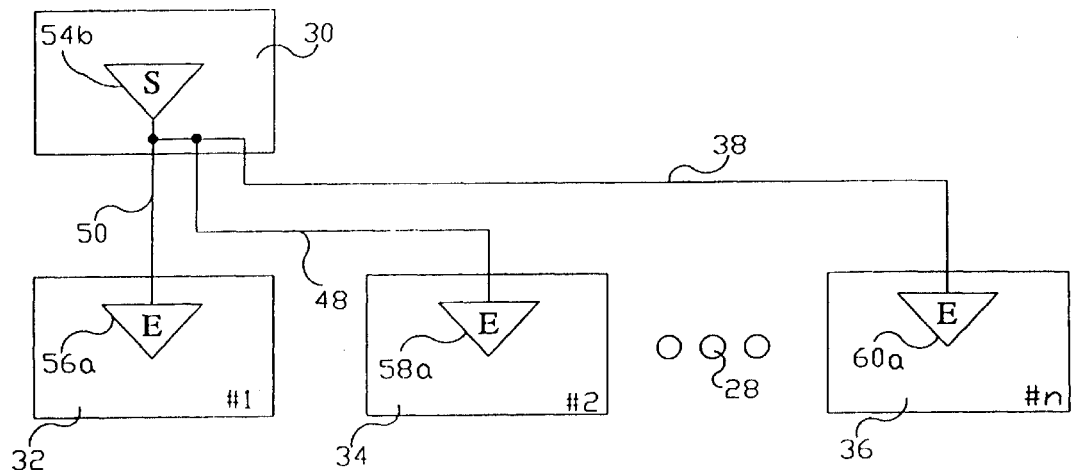
FIG. 2a is a schematic illustration of the direct module communication of the invention with a transmitting device and a plurality of receiver devices.
Figure 2B:
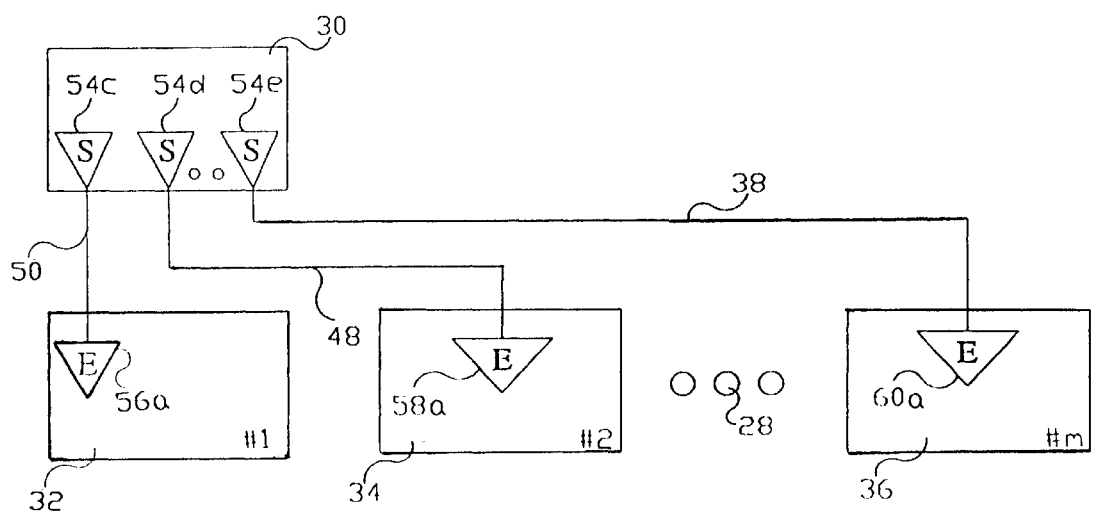
FIG. 2b is a schematic illustration of the direct module communication of the invention, wherein one receiver device is associated with each transmitting device.
Figure 2C:
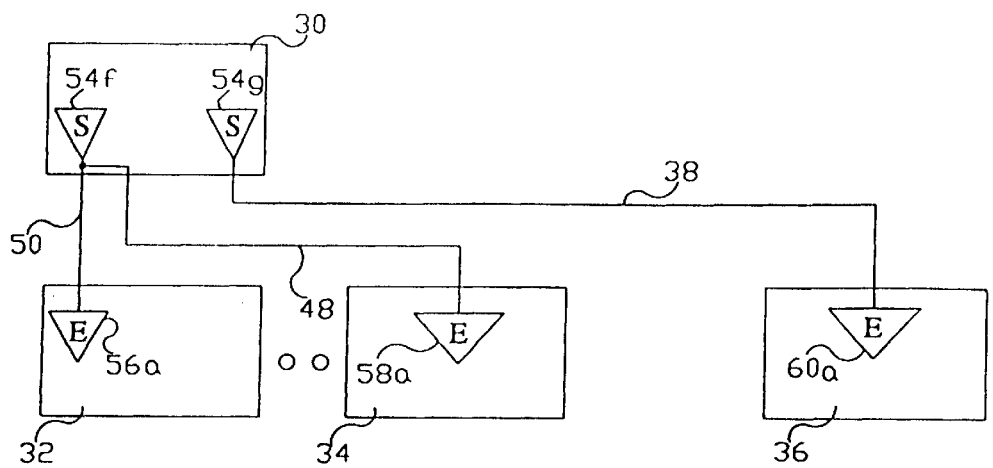
FIG. 2c is a schematic illustration of the direct module communication of the invention in a combination of the structures of FIGS. 2a and 2b.

FIGS. 2a to 2c are to show various modes of direct communication between modules of a device 24 of the invention. In FIGS. 2a to 2c, the removable modules 30, 32, 34 and 36 are shown as blocks. Dots 28 indicate that any number of modules could be used. The number of modules is, however, dependent only on the accommodation capacity of the cabinet frame. Referring to the embodiments of FIGS. 2a to 2c, the transfer of data from a first module 30 to the other modules 32, 34, 36 is to be described:

In the embodiment of FIG. 2a, only one transmitting device 54b of the first module 30 is shown. The transmitting device 54b may be an integral part of the data transmission controller or may be a separate component. By dividing the connection cable, the transmitted data of the first module 30 are sent to receivers 56a, 58a and 60a of the modules 32, 34, 36, respectively, on direct paths through the connections 38, 48 and 50. The receiver devices 56a, 58a and 60a are also either part of the data transmission controller or are separate components.

In the embodiment of FIG. 2b, an own transmitting device 54c, 54d, 54e of the first module 30 is shown for each direct connection 38, 48, 50, respectively. The transmitting devices 54c, 54d, 54e may be integral parts of the data transmission controller or may be separate components. In this embodiment, dividing the connection cable is not necessary, as a separate transmitting device is provided for each receiver device. The data to be transmitted from the first module 30 are sent on direct paths through connections 38, 48 and 50 to receiver devices 56b, 58b and 60b, respectively, of the other modules 32, 34, 36, respectively, where they are, eventually, stored, for further processing, in a data memory. The receiver devices 56a, 58a and 60a are either part of the data transmission controller 54 or are separate components.

The embodiment of FIG. 2c combines the two modes of direct connection shown in FIG. 2a and FIG. 2b. Referring to FIG. 2c, both a transmitting device 54f with division of the transmitting cable and a transmitting device 54g without division of the connecting cable are provided. The transmitting devices 54f and 54g may be integral parts of the data transmission controller 54 or may be separate components. The transmitted data of the first module are sent to receiver devices 56b, 56b and 60b of the other modules 32, 34, 36, respectively, on direct paths through the connections 38, 48 and 50, where they eventually are stored, for further processing, in a data memory. The receiver devices 56a, 58a and 60a may be either integral parts of the data transmission controller or may be separate components.

The modes of direct data transmission, as illustrated in FIGS. 2a to 2c, prevent the data fluxes from colliding in any way, as these fluxes pass always on direct paths from the transmitting device to the receiving device.

Figure 3:
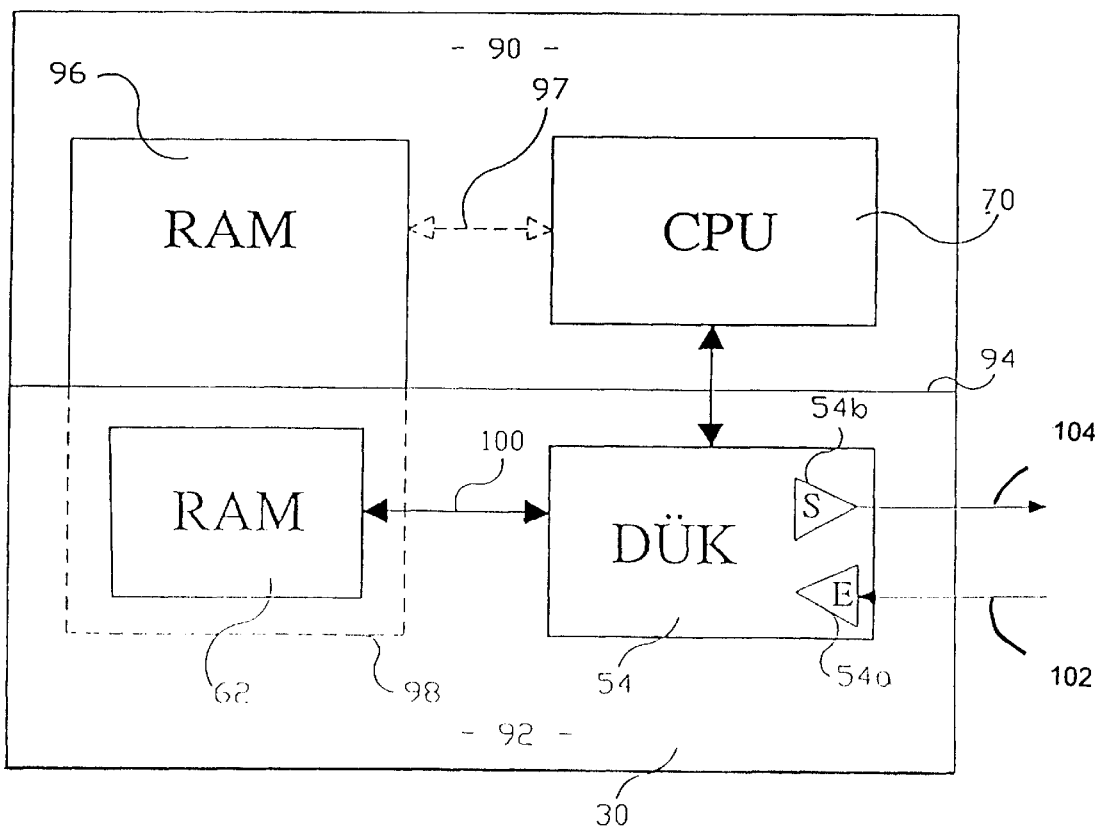
FIG. 3 is a schematic illustration of the module structure in the area which is relevant for the direct module communication.

FIG. 3 illustrates, in principle, the module construction of a module 30, as required to permit direct communication with other modules. The module 30 contains a functional unit 90 which performs the module function proper, and a data transmitting unit 92 for transmitting data. In this illustration, the functional unit 90 is shown separated from the data transmitting unit 92 by a line 94. The functional unit 90 comprises a processor unit (CPU) 70 and a memory 96. The processor unit 70 is connected with the memory 96. Arrow 97 indicates the access to the memory 96. The data memory 62 for the data transmitting may be a data memory separated from the functional unit 90, but may also be integrated in the memory 96 of the functional unit 90 as a memory area, as shown in this embodiment. Therefore, the memory 96 of the functional unit 90 reaches, as a dashed partial block 98, also into the data transmitting unit.

The data transmission controller 54 is connected with this data memory 62. The data exchange is symbolized by arrow 100. Data to be transmitted are stored in the data memory 62 either directly by the processor unit 70 or indirectly through the data transmission controller 54, depending on whether the processor unit has direct access to the data memory 62 or not. Furthermore, the data transmission controller 54 comprises a receiver device 54a and a transmitting device 54b. The receiver device 54a and the transmitting device 54b serve to receive data from other modules or to transmit data to other modules, respectively. Arrows 102 and 104 indicate the receiving and the transmitting, respectively. As required, the data may be transferred between the modules either serially or in parallel. All data transmitting functions and the elements therefor are, as far as possible, separated from the remaining module function of the respective module.

Figure 4:
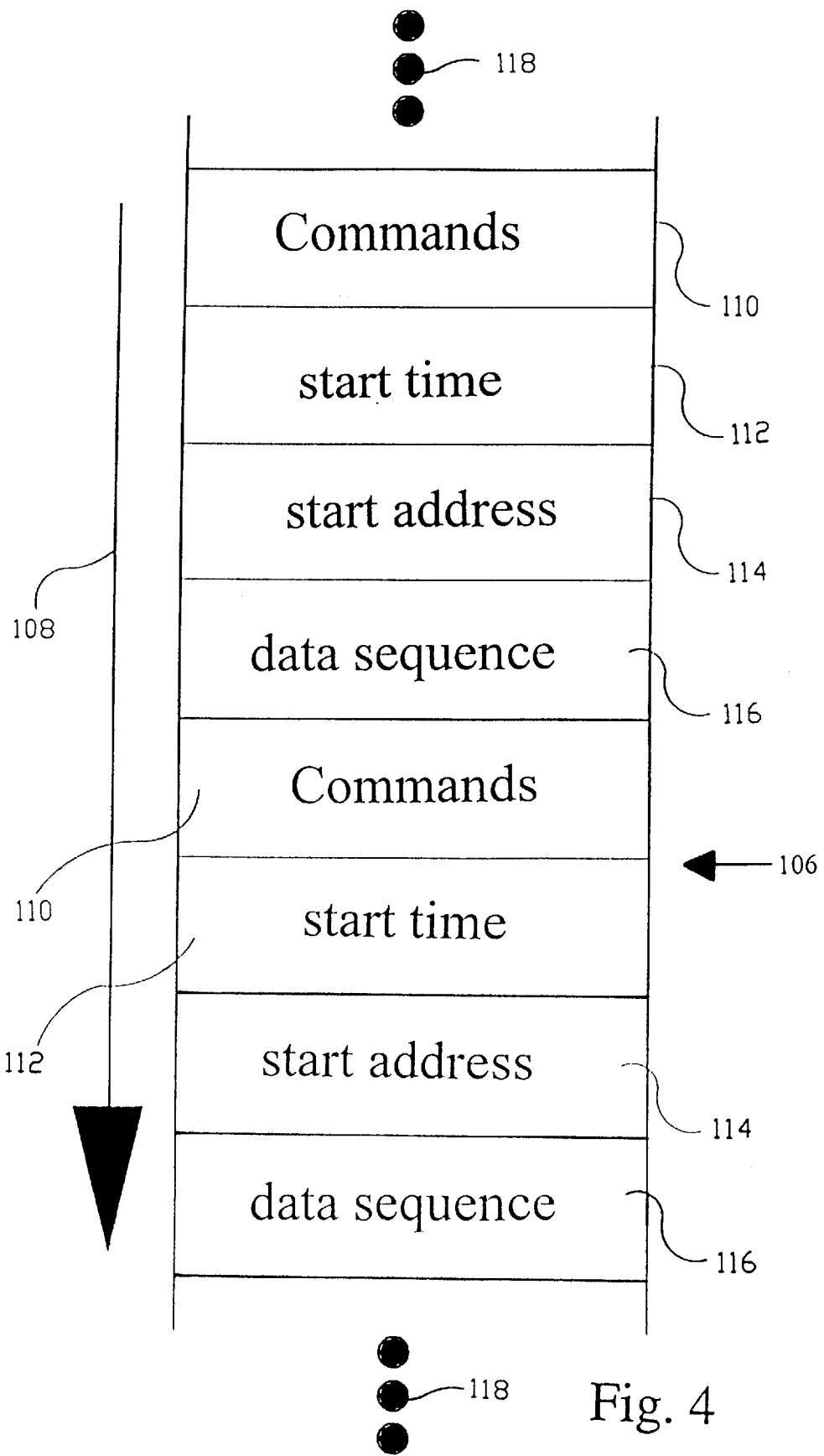
FIG. 4 illustrates the principle of the transmission protocol.

FIG. 4 illustrates the principle of a transmission protocol required for the direct communication. This is a time-controlled, not interrupt-controlled transmission protocol. The transmission protocol is shown as a control sequence 106, which is processed in the data transmission controller 54. The control sequence is processed in the direction of arrow 108. The control sequence 106 consists substantially of four control blocks. A first block 110 contains commands for the sequence of operation of the data transmitting. A second block 112 contains the start time, when data are to be transmitted. A third block 114 contains the respective start address of the data sequence to be transmitted in data memory 62, and block 116 contains the magnitude of the data sequence to be transmitted. Often, the control sequence consists of many consecutive control sequences. This is symbolized by dots 118.

I claim:

1. A modular electronic device comprising a cabinet frame, a plurality of push-in modules with module frames retained in said cabinet frame side-by-side, printed circuit boards mounted in said module frames, and electronic components carried by said printed circuit boards, and communication means for establishing communication between each of said modules and at least another one of said modules, said communication means comprising autonomous data transmitting and receiving means in each of said modules and, separate connecting means associated with each of said modules for directly connecting the respective module with other modules, each of said separate connecting means being connected to said data transmitting means of one of said modules and to said data receiving means of another one of said modules.

2. A device as claimed in claim 1, said data transmitting means of each of said modules comprise a data transmitting controller.

3. A device as claimed in claim 2, wherein said data transmitting means of each of said modules include receiver device.

4. A device as claimed in claim 3, wherein said data transmitting means of each of said modules include a transmitter device.

5. A device as claimed in claim 1, wherein said data transmitting means are provided with a time-controlled communication protocol for transmitting data.

6. A device as claimed in claim 1, and further including a data memory connected with said data transmitting means.

7. A device as claimed in claim 1, and further comprising interface means provided at said modules for establishing communication with other ones of said modules.

8. A device as claimed in claim 1, wherein said cabinet frame is an integral part of an aircraft.

9. A device as claimed in claim 1, wherein each module further comprises distributor means for simultaneously transmitting data from said module to a plurality of other modules.

10. A method of communication between modules of a modular electronic device comprising a cabinet frame, a plurality of push-in modules with module frames retained in said cabinet frame, and printed circuit boards mounted in said module frames, and electronic components carried by said printed circuit boards, wherein each of said modules is separately and directly interconnected for data exchange with at least another one of said modules for direct communication between such modules.

11. A method as claimed in claim 10, wherein data to be transmitted are transmitted in accordance with a time-controlled communication protocol.

12. A method as claimed in claim 11, wherein said data to be transmitted are transmitted by means of a data transmission controller.

13. A method as claimed in claim 12, wherein said data to be transmitted are stored in memories for transmission and after reception, respectively.

14. A method as claimed in claim 10, wherein data to be transmitted from one module are, simultaneously, transmitted to a plurality of modules.

* * * * *

UNITED STATES PATENT AND TRADEMARK OFFICE
CERTIFICATE OF CORRECTION

PATENT NO. : 6,651,112 B1 Page 1 of 1
DATED : November 18, 2003
INVENTOR(S) : Reinhard Reichel It is certified that error appears in the above-identified patent and that said Letters Patent is hereby corrected as shown below:

Title page,
Item [54], Title, should read:
-- DATA TRANSMISSION BETWEEN CONNECTED MODULES WHEREIN EACH MODULE SEPARATELY AND DIRECTLY COMMUNICATES WITH OTHER MODULES --

Signed and Sealed this

Twenty-ninth Day of June, 2004

JON W. DUDAS
*Acting Director of the United States Patent and Trademark Office*